United States Patent
Leffel

(10) Patent No.: US 6,859,101 B1
(45) Date of Patent: Feb. 22, 2005

(54) FREQUENCY-SELECTIVE PHASE/DELAY CONTROL FOR AN AMPLIFIER

(75) Inventor: Michael David Leffel, Crystal Lake, IL (US)

(73) Assignee: Andrew Corporation, Orland Park, IL (US)

( * ) Notice: Subject to any disclaimer, the term of this patent is extended or adjusted under 35 U.S.C. 154(b) by 14 days.

(21) Appl. No.: 10/656,753

(22) Filed: Sep. 5, 2003

(51) Int. Cl.[7] .............................................. H03G 3/10
(52) U.S. Cl. ...................................... 330/280; 330/151
(58) Field of Search ............................... 330/280, 151, 330/149, 129, 136; 375/297; 455/63

(56) References Cited

U.S. PATENT DOCUMENTS

| | | | |
|---|---|---|---|
| 5,166,634 A | * | 11/1992 | Narahashi et al. ........... 330/151 |
| 6,326,840 B1 | * | 12/2001 | Funada et al. ................ 330/52 |
| 6,414,546 B2 | * | 7/2002 | Cavers ........................ 330/149 |

* cited by examiner

*Primary Examiner*—Henry Choe
(74) *Attorney, Agent, or Firm*—Steve Mendelsohn

(57) ABSTRACT

The insertion phase or delay of an amplifier can be controlled by comparing signals from the amplifier path with signals from a corresponding reference path without requiring the overall signal delay through the reference path to nominally match the overall signal delay through the amplifier path. Amplifier and reference path signals can be combined to form a combined signal whose power is detected using a narrow-band, frequency-selective power detector. For given phase and delay offsets between the amplifier and reference paths, cancellation (i.e., perfectly destructive interference) will occur at a series of different frequencies. By operating the power detector at one of these cancellation frequencies, a variable phase or delay adjuster in the amplifier path can be controlled to minimize the detected power level in order to achieve a desired level of insertion phase for the amplifier, without having to implement an expensive delay element in the reference path.

33 Claims, 5 Drawing Sheets

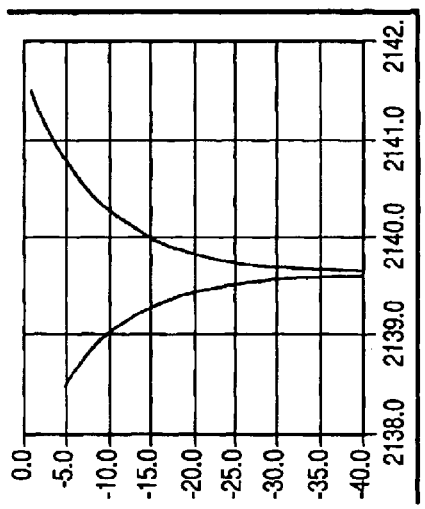
FIG. 8(c) 10-degree shift in phase delta
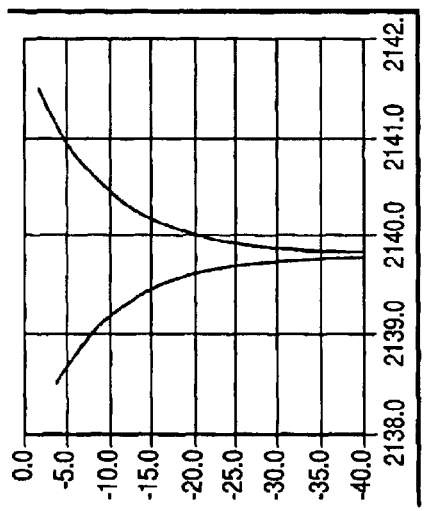
FIG. 8(b) 5-degree shift in phase delta
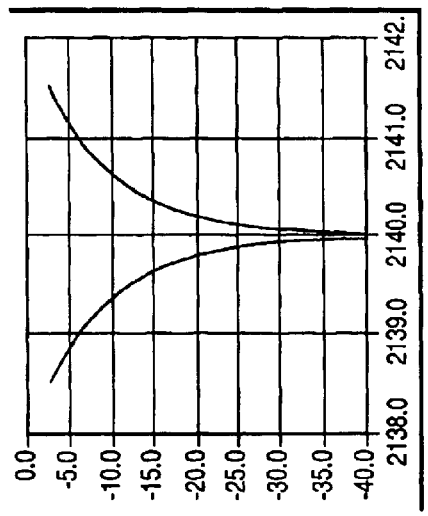
FIG. 8(a) properly aligned at 2140 MHz

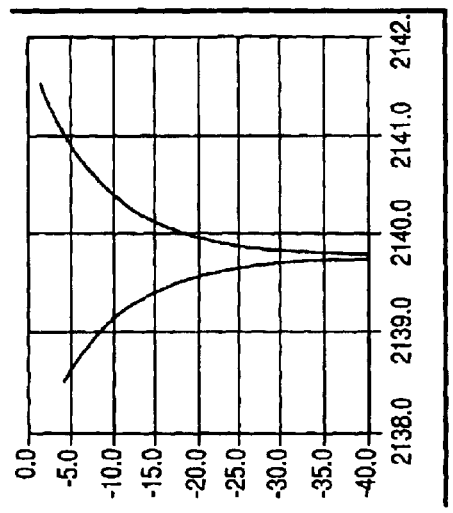
FIG. 9(c) 10-pS shift in delay delta
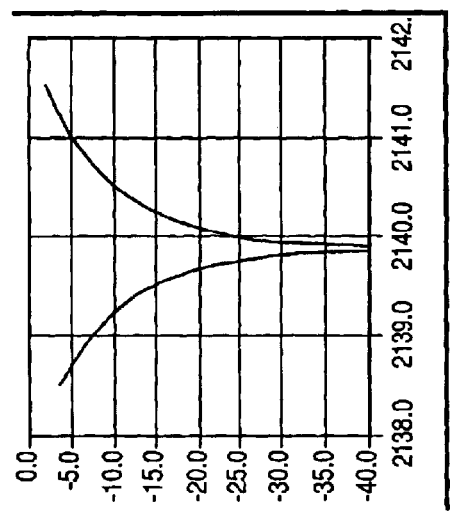
FIG. 9(b) 5-pS shift in delay delta
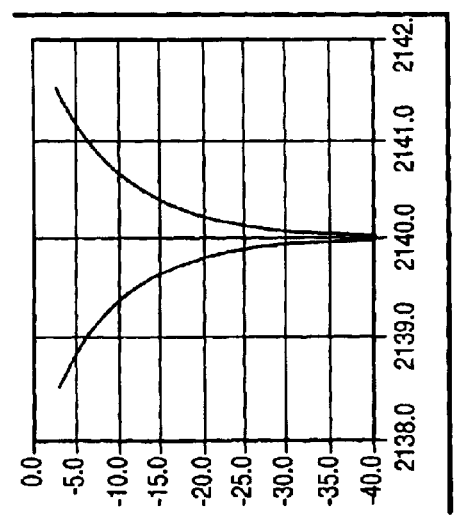
FIG. 9(a) properly aligned at 2140 MHz

FREQUENCY-SELECTIVE PHASE/DELAY CONTROL FOR AN AMPLIFIER

FIELD OF THE INVENTION

The present invention relates to signal processing, and, in particular, to techniques for controlling the insertion phase or delay of amplifiers.

BACKGROUND OF THE INVENTION

Feed-forward amplifiers have two cancellation loops: one for carrier cancellation and one for distortion cancellation. These cancellation loops naturally result in automatic gain and phase control of the amplifier that is "inside" the loops. Hence, power combing of multiple amplifiers is easy to accomplish with little or no effort.

Feed-forward amplifiers are being replaced with RF-input, digitally pre-distorted amplifiers. These amplifiers do not possess an automatic method for controlling gain or phase. Gain can be addressed with a minor amount of extra effort, but automatic phase control does not have an obvious, low-cost solution.

The prior art approaches this problem by matching the delay of the main amplifier path with the delay of a reference path. Once the delay of the two paths is matched, a variety of methods can be used to measure the relative insertion phase of the amplifier path against the reference path. One well-known technique would be to destructively combine a sample of each path, adjusting the amplifier path phase (and gain) to minimize the residual power. The power is typically read with some type of broadband detector, which can be built with a diode operating in the square law region. Variations on this detector include using correlators, log detectors, or phase detectors. The underlying principal is to match the delay of the amplifier path to the delay of the reference path so that broadband cancellation occurs, allowing the use of broadband detectors.

FIG. 1 shows a block diagram of such a prior-art amplifier system 100. Amplifier system 100 has an amplifier path and a reference path. The amplifier path includes variable amplitude adjuster 102, variable phase adjuster 104, and amplifier 106, while reference path includes delay element 108. In addition, amplifier system 100 has a feedback control loop comprising power detector 110 and microprocessor 112. The purpose of the reference path and the feedback control loop of amplifier system 100 is to ensure that, for a given input signal, the amplitude and phase of the output signal are at desired levels.

In operation, the amplitude and the phase of an input signal can be adjusted as needed by adjusters 102 and 104, respectively, before the signal is applied to amplifier 106. A portion of the input signal is tapped off at node 114 as a reference signal and applied to delay element 108, whose purpose is to ensure that the overall signal delay of the reference path matches the overall signal delay of the amplifier path. The delayed reference signal from delay element 108 is then applied to node 118, which also receives a portion of the output signal tapped off at node 116. Node 118 combines the two signals received from delay element 108 and node 116.

When the overall signal delay of the amplifier path identically matches the overall signal delay of the reference path, then adjusters 102 and 104 can be set such that the two signals applied to node 118 will be 180° out of phase and equal in amplitude for all signal frequencies. In that case, the interference between the two signals will be perfectly destructive for all frequencies, and power detector 110 should detect minimal power in the signal received from node 118. If the delay of the reference path were not designed (e.g., with delay element 108) to match the delay of the amplifier path, then the two signals input to node 118 would not be 180° out of phase for all signal frequencies, and the interference between the two signals would not be perfectly destructive for all frequencies. As used in the specification, the term "cancellation" refers to situations in which interference between two combined signals results in approximately perfect destruction, whether or not the two signals have exactly 180 degrees of phase difference and exactly equal magnitude and cancel each other completely. In such situations, the resulting combined signal will have minimal, if not zero, power. Those skilled in the art will appreciate that nodes 114 and 116 are typically implemented using couplers with appropriate scale factors that ensure that cancellation is substantially complete for nominal operations.

Microprocessor 112 monitors the detected power levels from detector 110 to control the adjustments made to the input signal by amplitude and phase adjusters 102 and 104 in order to minimize the detected power and thereby minimize the overall signal amplitude and phase differences between the amplifier and reference paths (also referred to herein as amplitude and phase offsets or amplitude and phase mismatches). Since delay element 108 nominally equalizes the overall signal delays between the amplifier and reference paths for all signal frequencies, then power detector 110 may be implemented using any of a wide range of types of power detectors, include either wide-band or narrow-band power detectors.

The cancellation technique of FIG. 1 works well when the delay of the amplifier path is short and/or building the reference path delay element is not too costly. If, however, the amplifier path delay is not short, then it can be expensive to realize a reference path delay that is broadband, relatively constant with time, operating power, and temperature, and easy to manufacture. The typical choices for an amplifier in the Universal Mobile Telecommunication Service (UMTS) band, for instance, would be a cavity filter, printed transmission lines, or coaxial cable. Each of these has its drawbacks in performance, and all of them are costly. For example, a rule of thumb might be to assume $1 per nsec of delay for a coaxial solution. A typical RF pre-distorted amplifier might have 80–85 nsec of delay, making this a costly solution.

BRIEF DESCRIPTION OF THE DRAWINGS

Aspects, features, and advantages of the present invention will become more fully apparent from the following detailed description, the appended claims, and the accompanying drawings in which like reference numerals identify similar or identical elements.

FIGS. 8(a)–(c) show graphical representations of combined signal power for an amplifier system having a nominal delay offset of 80 nsec with cancellation at 2140 MHz for different phase shifts; and FIGS. 9(a)–(c) show graphical representations of combined signal power for an amplifier system having a nominal delay offset of 80 nsec with cancellation at 2140 MHz for different delay shifts.

DETAILED DESCRIPTION

Figure 2:
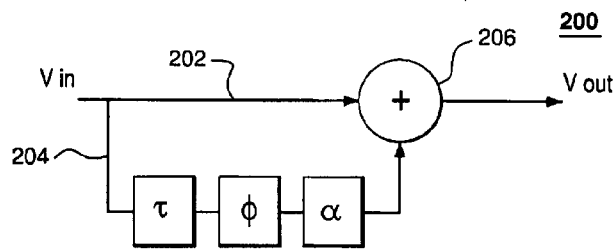
FIG. 2 shows a high-level block diagram of an amplifier system having an input signal Vin, which drives two paths that are then recombined to form an output signal Vout.

FIG. 2 shows a high-level block diagram of an amplifier system 200 having an input signal Vin, which drives two paths 202 and 204, which are then recombined (at node 206) to form an output signal Vout. When there is a delay mismatch between the two paths, the result of combining a sample of each path will be constructive or destructive depending on the frequency of operation and the amount of delay mismatch. As represented in FIG. 2, $\tau$ represents the difference in delay between the two paths, $\phi$ represents the difference in phase between the two paths, and $\alpha$ represents the attenuation of second path 204 relative to first path 202.

The input and output signals Vin and Vout may be represented as a function of time at a particular frequency $\omega=2\pi f$ according to the following Equations (1) and (2):

$$\text{Vin}(t) = A \cos(\omega \cdot t) \quad (1)$$

$$\text{Vout}(t) = A \cos(\omega \cdot t) + \alpha \cdot A \cos(\omega \cdot (t+\tau) + \phi). \quad (2)$$

To achieve cancellation, Vout(t) is driven to zero. This will happen if the following Equation (3) is satisfied for all time t:

$$A \cos(\omega \cdot t) + \alpha A \cos(\omega \cdot (t+\tau) + \phi) = 0. \quad (3)$$

Rewriting Equation (3) yields Equations (4) and (5) as follows:

$$\cos(\omega \cdot t) = -\alpha \cos(\omega \cdot (t+\tau) + \phi) \quad (4)$$

$$\cos(\omega \cdot t) = \alpha \cos(\omega \cdot (t+\tau) + \phi + \pi). \quad (5)$$

Two sinusoids will be equal to each other at all times if their magnitudes and phases are equal. Applying these conditions to the two sinusoids of Equation (5) yields Equations (6) and (7) as follows:

$$\alpha = 1 \quad (6)$$

$$\omega \cdot t = \omega \cdot (t+\tau) + \phi + \pi + N 2\pi. \quad (7)$$

where N is an integer.

Solving Equation (7) for the delay difference $\tau$ yields Equation (8) as follows:

$$\tau = \frac{N 2\pi - \phi - \pi}{\omega} = \frac{N - \frac{\phi}{2\pi} - \frac{1}{2}}{f}. \quad (8)$$

Equation (8) implies that cancellation at a particular frequency can be achieved with an arbitrary amount of delay mismatch as long as an appropriate amount of phase mismatch is selected, and vice versa. Moreover, for given levels of phase and delay mismatch, cancellation will occur at a series of frequencies.

With the goal of holding phase and gain constant in a delayed amplifier path (e.g., path 204 of FIG. 2) using a non-delayed reference path (e.g., path 202), the analysis can proceed by calculating a frequency where this cancellation will occur based on the desired insertion phase and the actual delay mismatch. Depending on the amount of delay mismatch that exists, multiple solutions (in frequency) may exist within the operating bandwidth of the amplifier. This presents options in selecting the frequency used to monitor the cancellation. For instance, if the signal consists of UMTS carriers that are relatively constant in frequency, it may be desirable to have the cancellation occur at a frequency occupied by a UMTS carrier to avoid the use of a pilot tone signal. Alternatively, if a pilot tone signal is used for the cancellation, then a frequency that is not currently being used by the transmitter driving the amplifier system can be selected.

Figure 1:
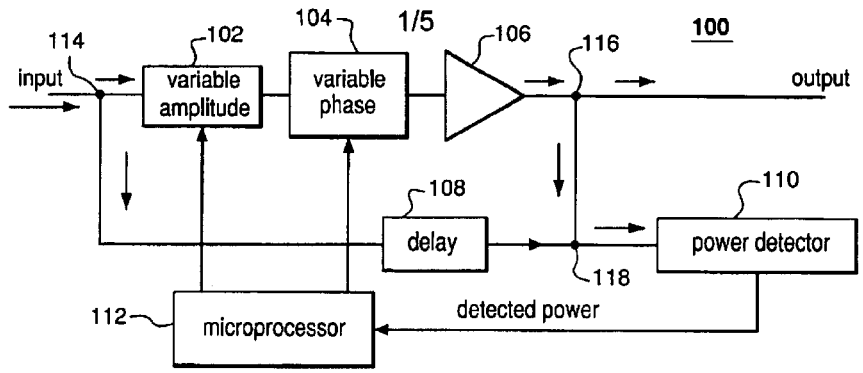
FIG. 1 shows a block diagram of a prior-art amplifier system.
Figure 3:
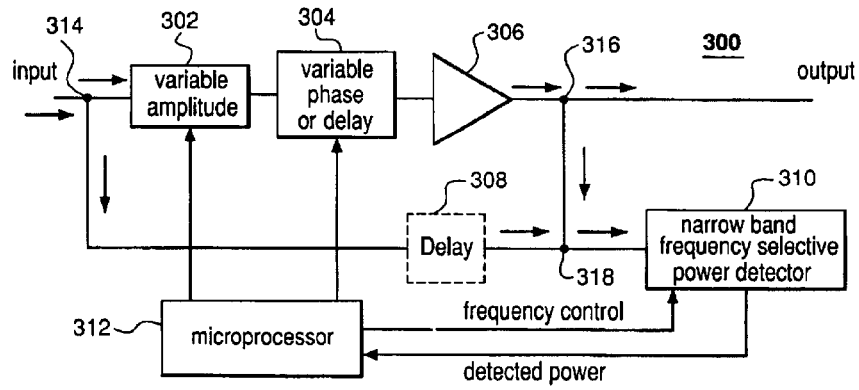
FIGS. 3–6 show high-level block diagrams of amplifier systems according to different embodiments of the present invention.

FIG. 3 shows a high-level block diagram of an amplifier system 300, according to one embodiment of the present invention. Amplifier system 300 is similar to prior-art amplifier system 100 of FIG. 1. One significant difference between the two systems, however, is that amplifier system 300 does not have a delay element, similar to delay element 108, in its reference path that equalizes the overall signal delays of the amplifier and reference paths.

Like prior-art amplifier system 100, amplifier system 300 has an amplifier path and a reference path. Like the amplifier path of system 100, the amplifier path of system 300 includes a variable amplitude adjuster (302), a variable phase adjuster (304), and an amplifier (306). As mentioned before, however, the reference path of system 300 does not have a delay element that equalizes the overall signal delays of the amplifier and reference paths. Depending on the particular implementation, the reference path may have an optional delay element, such as delay element 308 of FIG. 3, but that delay element is not intended to equalize the overall signal delays of the amplifier and reference paths. In fact, delay element 308, if used, is preferably implemented using a relatively inexpensive delay element, such as a 500-nsec SAW filter, that causes the delay of the reference path to be much greater than the delay of the amplifier path.

In either case, the overall signal delay of the amplifier path of amplifier system 300 will typically be either significantly longer than (e.g., when delay element 308 is not included) or significantly shorter than (e.g., when delay element 308 is included) the overall signal delay of its reference path. Depending on the particular application and implementation details, delay offsets between the amplifier and reference paths can range from tens of nanoseconds to thousands of nanoseconds or even longer. Moreover, for a given system design, the delay offsets may vary significantly from system to system as a result of differences during fabrication and manufacturing.

Like prior-art amplifier system 100, amplifier system 300 also has a feedback control loop that includes a power detector (310) and a controller (e.g., microprocessor 312). In amplifier system 300, however, power detector 310 is preferably a narrow-band, frequency-selective power detector that is capable of detecting signal power level over a relatively narrow, selected frequency range, where the detector can be controlled to sequentially operate at a variety of different such narrow-band frequencies.

In operation, in the amplifier path, the amplitude and phase/delay of an input signal are controllably adjusted by adjusters 302 and 304, respectively, prior to being amplified by amplifier 306. Prior to such adjustment and amplification, a portion of the input signal is tapped off at node 314 as a reference signal. When delay element 308 is not included, the reference signal is applied directly (i.e., without any intervening delay elements other than the signal path conductor itself) to node 318, which also receives a portion of the output signal tapped off at node 316. Node 318 combines the two signals received from nodes 314 and 316 to form a combined signal.

Power detector 310 measures the power of the combined signal from node 318 at a selected frequency. Microprocessor 312 controls the operations of adjusters 302 and 304 based on the detected power levels from power detector 310. In addition, microprocessor 312 controls the selection of the frequency at which power detector 310 operates.

At any given time, the amplifier path will have a particular phase offset and a particular delay offset relative to the reference path. According to Equation (8), these delay and phase differences will result in perfect cancellation at a series of particular frequencies. By monitoring the power of the combined signal at one of these particular frequencies, microprocessor 312 can control the amplitude and phase/delay of the signal applied to amplifier 306 to minimize the detected power, without having to implement a delay element in the reference path that equalizes the overall signal delays between the amplifier and reference paths.

In this way, amplifier system 300 can be operated to ensure that the amplifier path maintains a desired insertion phase or delay. If, for example, a different insertion phase is desired, Equation (8) can be used to determine a cancellation frequency corresponding to the new insertion phase. Microprocessor 312 can then instruct power detector 310 to operate at the new frequency and then control adjusters 302 and 304 in order to minimize the detected power from node 318, thereby achieving the new desired insertion phase.

The ability to select the operating frequency of power detector 310 also provides an easy way to compensate for variations from unit to unit in insertion phase and/or delay. If, for example, the insertion phase of the reference path is slightly high or low, then a new frequency can be calculated to achieve the desired insertion phase in the amplifier path.

A similar technique can be used to temperature compensate the insertion phase or delay variation of the reference path. Once the amount of variation is identified as a function of temperature (or any other parameter), the cancellation frequency can be chosen to compensate for that variation. This can be accomplished without having to put a phase adjuster or a delay adjuster in the reference path.

Yet another benefit is that automatic gain control can also be provided as part of the control of the cancellation loop.

In the description so far, the technique has been described as a method to control the insertion phase and amplitude of the amplifier. Alternatively, this method could be used to control the insertion delay and amplitude.

The bandwidth of the frequency-selective power detector will limit the amount of delay mismatch that can be accommodated between the two paths. For instance, if the delay mismatch is very large, then, according to Equation (8), the cancellation bandwidth will be very narrow and a narrower-bandwidth power detector should be used.

Another consideration on the delay mismatch involves the signal that will be used to drive the cancellation loop. If a UMTS carrier is assumed to be centered around the cancellation frequency, then whatever frequency the transmitter is currently using will have to be employed. A typical UMTS carrier can be centered at any multiple of 200 KHz within the 2110- to 2170-MHz band. One approach would be to target a delay mismatch that creates a cancellation null every 200 KHz. This would enable the cancellation null to be located at the center frequency of any UMTS carrier. This would involve a delay mismatch on the order of 2500 nsec, and a receiver bandwidth that is a small fraction of 200 KHz. Since the UMTS carrier is spread over 3.84 MHz, it is not necessary to have the nulls occur every 200 KHz. To take the example a little farther, having the nulls occur every 1 MHz would still enable more than one null to be found within the bandwidth of a UMTS carrier. The delay mismatch needed is only 500 nsec. If necessary, an inexpensive delay element can be added, e.g., to the reference path, such as delay element 308 of FIG. 3, to achieve the desired level of delay mismatch. There are low-cost options available for a 500-nsec delay line at 2 GHz, for example, using a SAW filter.

In one implementation that uses a reference path with relatively low delay, the delay delta between the two paths is approximately 80 nsec. According to Equation (8), the cancellation nulls will be separated by about 12.5 MHz. With a 60-MHz operating band, there will be at least four different frequencies within the UMTS operating band that can be used for cancellation. The assumption is that at least one of these frequencies is available at all times. Since a UMTS carrier might not be available at an appropriate frequency when it is needed, a pilot tone can be injected into the reference path.

If both of the two options listed (i.e., using the transmitted signal to control the cancellation loop or injecting a pilot tone) do not work out, because an appropriate frequency for monitoring the cancellation cannot be identified, then the option still exists of adding a phase or delay adjust (e.g., an inexpensive, coarse, variable delay element) to the reference path. Again, if needed, a suitable frequency can be calculated or measured for each setting of such a variable delay or phase element. With the addition of a variable delay or phase element to the reference path, an even larger variety of delay differences between the two paths can be handled.

Figure 4:
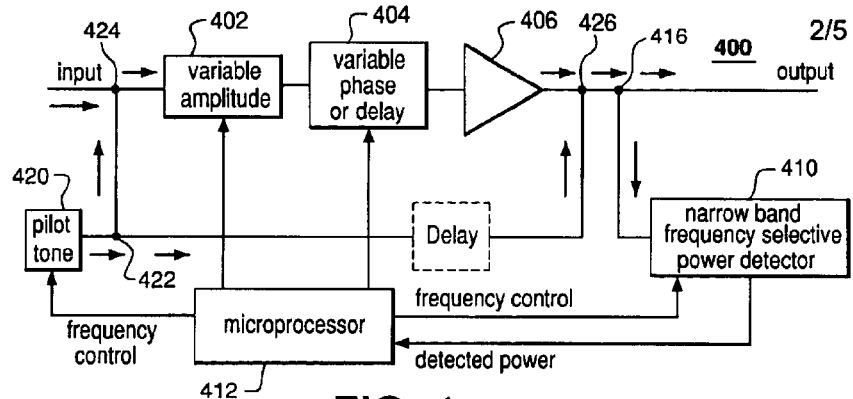

FIG. 4 shows a high-level block diagram of an amplifier system 400, according to an alternative embodiment of the present invention. Amplifier system 400 is similar to amplifier system 300 of FIG. 3, except that, in amplifier system 400, a pilot tone is injected into both the amplifier and reference paths for cancellation.

In particular, amplifier system 400 has variable amplitude adjuster 402, variable phase adjuster 404, amplifier 406, narrow-band frequency-selective power detector 410, and microprocessor 412, which are analogous to corresponding elements in amplifier system 300. In addition, amplifier system 400 has pilot tone generator 420, which injects a pilot tone into both the amplifier path (via nodes 422 and 424) and the reference path. The pilot tone in the reference path is added to the output of amplifier 406 at node 426. Part of the resulting combined signal is tapped off at node 416 and fed to power detector 410.

As in the previous embodiment, the frequency of the pilot tone is preferably selected such that Equation (8) is satisfied for the existing phase and delay offsets. As before, the desired amplitude and phase of the amplifier path can be achieved by controlling the amplitude and phase adjusters to minimize the detected power. If pilot tone generator 420 is tunable, then microprocessor 412 can change the pilot tone frequency as necessary to achieve desired results. Depending on the particular application, it may be desirable to select a pilot tone that has a frequency that is outside of the frequency range of the input signal.

The embodiment of FIG. 3 supports operating modes in which the input signal is split between the amplifier and reference paths, while the embodiment of FIG. 4 supports operating modes in which a pilot tone is injected into both the amplifier and reference paths. Alternative embodiments may be implemented that support both of these two sets of operating modes.

Figure 5:
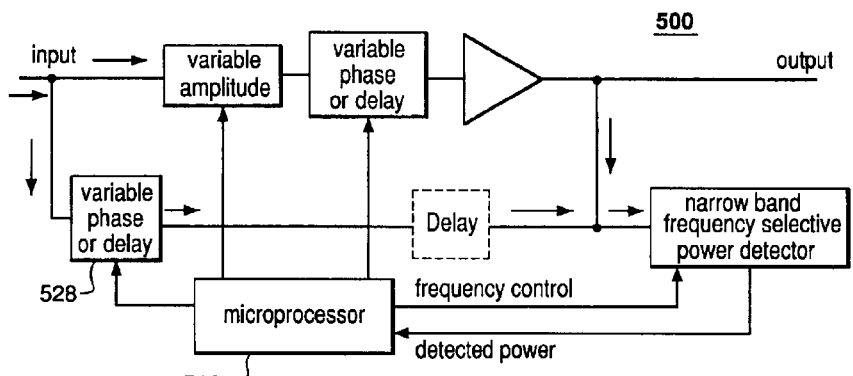

FIG. 5 shows a high-level block diagram of an amplifier system 500, according to another alternative embodiment of the present invention. Amplifier system 500 is similar to amplifier system 300 of FIG. 3, except that amplifier system 500 has a variable phase (or delay) adjuster 528 in its reference path. According to this embodiment, if there are no frequencies in the current input signal that satisfy Equation (8) for a current set of phase and delay offsets, then adjuster 528 can be controlled by microprocessor 512 to change the phase or delay of the reference path as needed to ensure that at least one frequency in the current input signal satisfies Equation (8).

Figure 6:
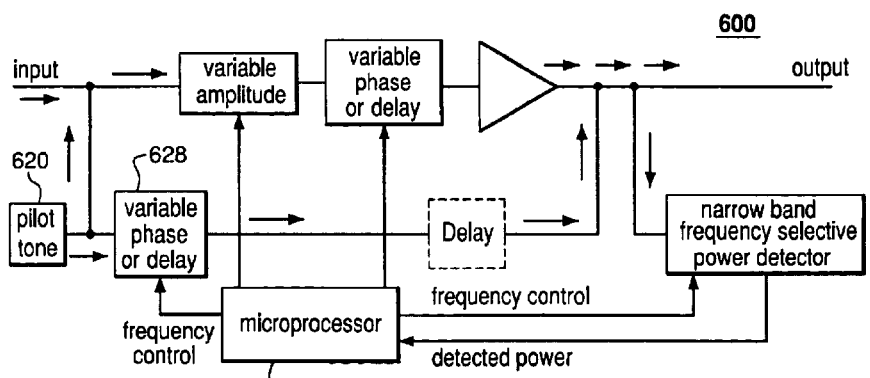

FIG. 6 shows a high-level block diagram of an amplifier system 600, according to yet another alternative embodiment of the present invention. Amplifier system 600 is similar to amplifier system 400 of FIG. 4, except that amplifier system 600 has a variable phase or delay adjuster 628 in its reference path. According to this embodiment, if pilot tone generator 620 is not capable of generating a frequency that satisfies Equation (8) for a current set of phase and delay offsets, then adjuster 628 can be controlled by microprocessor 612 to change the phase or delay of the reference path as needed to ensure that at least one available pilot tone frequency satisfies Equation (8).

Figure 7:
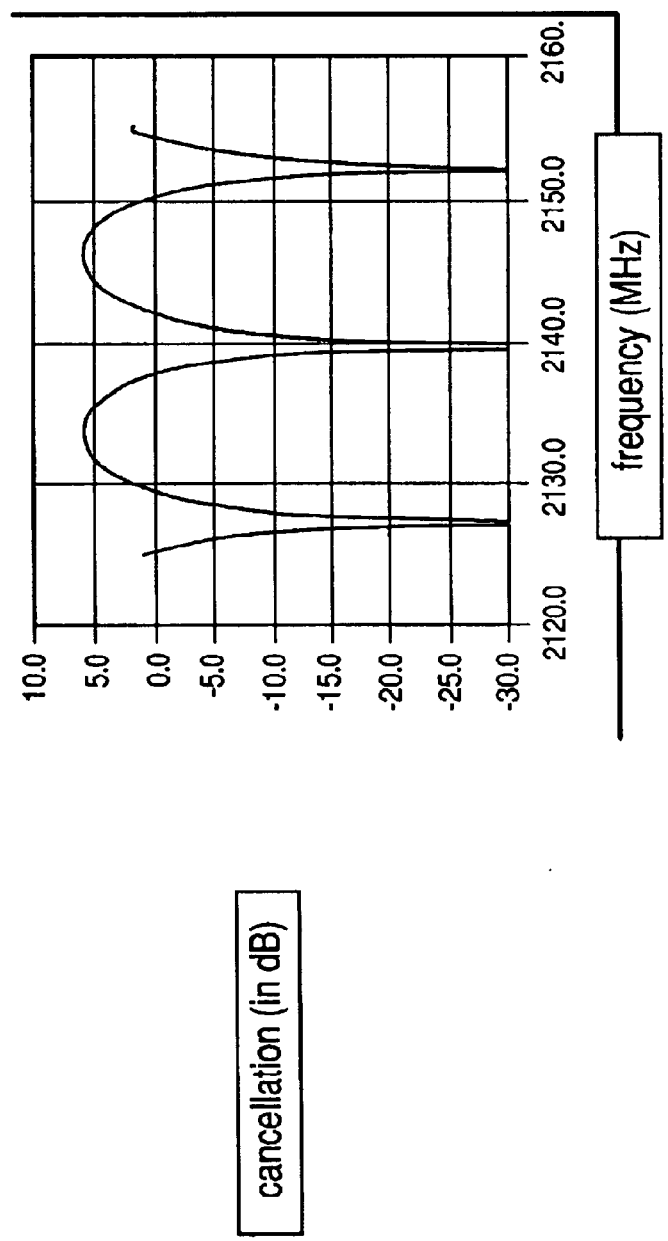
FIG. 7 shows a graphical representation of combined signal power over a particular frequency range for an amplifier system having a nominal delay offset of 80 nsec, showing the relationship between frequency and cancellation.

FIG. 7 shows a graphical representation of the relationship between frequency and cancellation according to Equation (8) over a particular frequency range for a delay mismatch of 80 nsec and zero amplitude mismatch. As shown in FIG. 7, cancellation occurs at about 2127.5 MHz, 2140 MHz, and 2152.5 MHz. As such, any of these frequencies could be used to control the cancellation loop to achieve the same amplifier path insertion phase or insertion delay value.

FIG. 8(*a*) shows a graphical representation of combined signal power for a properly aligned amplifier system having a delay offset of 80 nsec with cancellation at 2140 MHz. FIG. 8(*b*) shows a graphical representation of combined signal power for the same amplifier system after a 5-degree shift in phase in the amplifier path, while FIG. 8(*c*) shows a graphical representation of combined signal power for the same amplifier system after a 10-degree shift in phase in the amplifier path. These latter two figures show the impact to detected power level at 2140 MHz for relatively small shifts in insertion phase between the amplifier and reference paths and therefore demonstrate the efficacy of using detected power to control the insertion phase of the amplifier path.

Similarly, FIG. 9(*a*) shows a graphical representation of combined signal power for a properly aligned amplifier system having a delay offset of 80 nsec with cancellation at 2140 MHz. (Note that FIG. 9(*a*) is identical to FIG. 8(*a*).) FIG. 9(*b*) shows a graphical representation of combined signal power for the same amplifier system after a 5-psec shift in delay in the amplifier path, while FIG. 9(*c*) shows a graphical representation of combined signal power for the same amplifier system after a 10-psec shift in delay in the amplifier path. These latter two figures show the impact to detected power level at 2140 MHz for relatively small shifts in insertion delay between the amplifier and reference paths and therefore demonstrate the efficacy of using detected power to control the insertion delay of the amplifier path.

Alternative Embodiments

The present invention can be implemented in the context of a wide variety of amplifier systems, including those that rely on pre-compensation and/or feed-forward compensation to linearize an amplifier.

Equation (8) was derived for a system in which the signals generated by the two paths are combined using a summation node, and amplifier systems 300–600 are correspondingly shown using nodes that combine the amplifier and reference path signals by addition. It will be appreciated that the present invention could alternatively be implemented using a difference node that generates a combined signal based on the difference between the amplifier and reference path signals to achieve cancellation at particular frequencies.

Although the present invention has been described in the context of amplifier systems having an amplifier path with a variable amplitude adjuster followed by a variable phase adjuster followed by an amplifier, the present invention is not so limited. In other embodiments, the order of these elements in the amplifier path may be different. Moreover, in theory, the phase adjustment of the present invention can be implemented with or without any amplitude adjustment. Furthermore, the amplifier path could be implemented with a variable delay adjuster instead of a variable phase adjuster.

The present invention may be implemented in the context of wireless signals transmitted from a base station to one or more mobile units of a wireless communication network. In theory, embodiments of the present invention could be implemented for wireless signals transmitted from a mobile unit to one or more base stations. The present invention can also be implemented in the context of other wireless and even wired communication networks to reduce spurious emissions.

Embodiments of the present invention may be implemented as circuit-based processes, including possible implementation on a single integrated circuit (such as an ASIC or an FPGA), a multi-chip module, a single card, or a multi-card circuit pack. As would be apparent to one skilled in the art, various functions of circuit elements may also be implemented as processing steps in a software program. Such software may be employed in, for example, a digital signal processor, micro-controller, or general-purpose computer.

It will be further understood that various changes in the details, materials, and arrangements of the parts which have been described and illustrated in order to explain the nature of this invention may be made by those skilled in the art without departing from the scope of the invention as expressed in the following claims.

What is claimed is:

1. In an amplifier system, a method for amplifying an input signal to generate an amplified output signal, comprising:
   generating the amplified output signal using an amplifier path of the amplifier system;
   generating a reference signal using a reference path of the amplifier system;
   combining a sample of the amplified output signal and a sample of the reference signal to form a combined signal;
   detecting power level of the combined signal; and
   controlling operations of the amplifier path based on the detected power level, wherein overall signal delay of the amplifier path does not match overall signal delay of the reference path.

2. The invention of claim 1, wherein the power level of the combined signal is detected at a selected frequency corresponding to cancellation between the amplified output signal and the reference signal.

3. The invention of claim 2, wherein the selected frequency corresponds to a frequency present in the input signal.

4. The invention of claim 2, wherein:
   the reference signal corresponds to a pilot tone that is also injected into the amplifier path; and
   the selected frequency corresponds to the frequency of the pilot tone.

5. The invention of claim 2, further comprising changing the selected frequency over time.

6. The invention of claim 5, wherein the selected frequency is changed to achieve a different phase or gain insertion for the amplifier path.

7. The invention of claim 5, wherein the selected frequency is changed to compensate for changes in operating characteristics of the amplifier system.

8. The invention of claim 5, wherein the selected frequency is changed based on changes in frequency of the input signal.

9. The invention of claim 1, wherein controlling the operations of the amplifier path comprises controlling at least one of phase and delay of the amplifier path.

10. The invention of claim 9, wherein controlling the operations of the amplifier path further comprises controlling gain of the amplifier path.

11. The invention of claim 1, wherein the reference path is implemented without a delay element that nominally equalizes overall delay offset between the amplifier and reference paths.

12. The invention of claim 11, wherein the reference path comprises a delay element such that the overall signal delay of the reference path is larger than the overall signal delay of the amplifier path.

13. The invention of claim 1, wherein the reference path is implemented with a variable delay or phase element to controllably change overall delay or phase offset between the amplifier and reference paths.

14. The invention of claim 1, wherein the combined signal is formed from a summation of the amplified output signal sample and the reference signal sample.

15. An amplifier system for amplifying an input signal to generate an amplified output signal, the amplifier system comprising:
   an amplifier path adapted to generate the amplified output signal from the input signal;
   a reference path adapted to generate a reference signal;
   a node adapted to generate a combined signal from a sample of the amplified output signal and a sample of the reference signal;
   a power detector adapted to detect power level of the combined signal; and
   a controller adapted to control operations of the amplifier path based on the detected power level, wherein overall signal delay of the amplifier path does not match overall signal delay of the reference path.

16. The invention of claim 15, wherein the power detector is adapted to detect the power level of the combined signal at a selected frequency corresponding to cancellation between the amplified output signal and the reference signal.

17. The invention of claim 16, wherein the selected frequency corresponds to a frequency present in the input signal.

18. The invention of claim 16, further comprising a pilot tone generator adapted to generate a pilot tone that is injected into the amplifier and reference paths, wherein the selected frequency corresponds to the frequency of the pilot tone.

19. The invention of claim 18, wherein the controller is adapted to control operations of the pilot tone generator to change the frequency of the pilot tone.

20. The invention of claim 16, wherein the controller is adapted to change the selected frequency of the power detector over time.

21. The invention of claim 20, wherein the controller is adapted to change the selected frequency to achieve a different phase or gain insertion for the amplifier path.

22. The invention of claim 20, wherein the controller is adapted to change the selected frequency to compensate for changes in operating characteristics of the amplifier system.

23. The invention of claim 20, wherein the controller is adapted to change the selected frequency based on changes in frequency of the input signal.

24. The invention of claim 15, wherein:
   the amplifier path further comprises at least one of a variable phase adjuster adapted to adjust phase of the amplified output signal and a variable delay adjuster adapted to adjust delay of the amplified output signal; and
   the controller is adapted to control operations of the at least one of the variable phase adjuster and the variable delay adjuster.

25. The invention of claim 24, wherein:
   the amplifier path further comprises a variable amplitude adjuster adapted to adjust amplitude of the amplified output signal; and
   the controller is further adapted to control operations of the variable amplitude adjuster.

26. The invention of claim 15, wherein the reference path is implemented without a delay element that nominally equalizes overall delay offset between the amplifier and reference paths.

27. The invention of claim 26, wherein the reference path comprises a delay element such that the overall signal delay of the reference path is larger than the overall signal delay of the amplifier path.

28. The invention of claim 15, wherein the reference path comprises a variable delay or phase element adapted to controllably change overall delay or phase offset between the amplifier and reference paths.

29. The invention of claim 28, wherein the controller is adapted to control operations of the variable delay or phase element.

30. The invention of claim 15, wherein the node is adapted to form the combined signal from a summation of the amplified output signal sample and the reference signal sample.

31. The invention of claim 15, wherein the amplifier system is implemented in a single integrated circuit.

32. An integrated circuit having an amplifier system for amplifying an input signal to generate an amplified output signal, the amplifier system comprising:
   an amplifier path adapted to generate the amplified output signal from the input signal;
   a reference path adapted to generate a reference signal;
   a node adapted to generate a combined signal from a sample of the amplified output signal and a sample of the reference signal;
   a power detector adapted to detect power level of the combined signal; and
   a controller adapted to control operations of the amplifier path based on the detected power level, wherein overall signal delay of the amplifier path does not match overall signal delay of the reference path.

33. An amplifier system for amplifying an input signal to generate an amplified output signal, the amplifier system comprising:
   an amplifier path adapted to generate the amplified output signal from the input signal;
   a reference path adapted to generate a reference signal;
   a node adapted to generate a combined signal from a sample of the amplified output signal and a sample of the reference signal;
   a power detector adapted to detect power level of the combined signal; and
   a controller adapted to control operations of the amplifier path based on the detected power level, wherein the reference path is implemented without a delay element that nominally equalizes overall delay offset between the amplifier and reference paths.

* * * * *